United States Patent
Bex et al.

(10) Patent No.: US 7,628,875 B2
(45) Date of Patent: Dec. 8, 2009

(54) MEMS DEVICE AND ASSEMBLY METHOD

(75) Inventors: Jan Bex, Overpelt (BE); Raymond Jacobus Knaapen, Helmond (NL); Gerard Johannes Pieter Nijsse, Best (NL); Gerard Kums, Molenstede (BE)

(73) Assignee: ASML Netherlands B.V., Veldhoven (NL)

( * ) Notice: Subject to any disclaimer, the term of this patent is extended or adjusted under 35 U.S.C. 154(b) by 653 days.

(21) Appl. No.: 11/519,204

(22) Filed: Sep. 12, 2006

(65) Prior Publication Data

US 2008/0063830 A1   Mar. 13, 2008

(51) Int. Cl.
*B32B 37/12* (2006.01)

(52) U.S. Cl. .............................. 156/64; 427/98.4; 427/9

(58) Field of Classification Search .................. 156/64; 427/98.4, 9, 8

See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2004/0041104 A1 | 3/2004 | Liebregts et al. | |
| 2004/0130561 A1 | 7/2004 | Jain | |
| 2005/0007572 A1 | 1/2005 | George et al. | |
| 2005/0126700 A1* | 6/2005 | Makimoto et al. | .......... 156/285 |

FOREIGN PATENT DOCUMENTS

WO   WO 98/33096   7/1998
WO   WO 98/38597   9/1998

* cited by examiner

*Primary Examiner*—Khanh Nguyen
*Assistant Examiner*—John Blades
(74) *Attorney, Agent, or Firm*—Sterne, Kessler, Goldstein & Fox P.L.L.C

(57) ABSTRACT

A method of bonding a MEMS device to a substrate to form a MEMS device assembly. A thickness profile of the MEMS device and/or the flatness of the mating surface of the substrate is determined. An adhesive is deposited onto a mating surface of the MEMS device and/or the mating surface of the substrate. The mating surfaces of the MEMS device and substrate are brought together, such that the adhesive can bond the MEMS device to the substrate. The volume of adhesive deposited at particular locations on the mating surface is varied to compensate for local variations in the thickness profile of the MEMS device and/or the flatness of the mating surface of the substrate.

11 Claims, 5 Drawing Sheets

MEMS DEVICE AND ASSEMBLY METHOD

BACKGROUND OF THE INVENTION

1. Field of the Invention

The present invention relates to MEMS (Micro Electro Mechanical System) devices and a method of manufacturing MEMS device assemblies.

2. Related Art

A MEMS device is a miniature device, which can typically be formed of a combination of mechanical parts and electrical circuits. The components of a MEMS device can, for example, have dimensions ranging from sub-micrometers to a few hundred micrometers. MEMS devices are typically formed on a semiconductor chip. MEMS devices can, for example, be formed using a lithographic apparatus. There are a number of known applications for MEMS devices, for example they can be used as sensors, actuators or process control units.

In certain applications the flatness of a surface, for example an active surface of a MEMS device, can be important. For example, a MEMS device can be an optical MEMS device (e.g., having an active surface that is arranged to reflect light), and as such the flatness of the active surface can affect its optical properties. It will be appreciated that the flatness of a surface is a measure of the extent to that the surface conforms to a single plane (and can, therefore, be considered as a measure of the evenness of a surface). Since MEMS devices can incorporate very small features, it can be appreciated that a surface can be considered unflat in the context of MEMS devices that in other applications can be considered to have a high level of flatness. For example, it can be desirable for the surface of a MEMS device to have a surface with unflatness in the region of a few nanometers (e.g., about 10 nanometers) or a few microradians maximum slope deviation (e.g., about 0.2 microradians). This can, for example, correspond to fractions of a wavelength of light used to illuminate the MEMS device.

Localized variations in the flatness of a surface of a MEMS device can, for example, be the result of variations in the thickness of the MEMS device itself. A MEMS device can be attached to a supporting substrate to provide a MEMS device assembly and, therefore, variation in the flatness of a substrate to that the MEMS device is attached can (additionally or alternatively) result in variations in the flatness of a surface of the MEMS device. In some applications, it can be extremely difficult, or even impossible, to correct flatness errors by means of alignment adjustments or calibration. Accordingly, it can be desirable to provide a MEMS device that, in at least some embodiments, provides an active surface with improved flatness.

Therefore, what is needed is a system and method to obviate or mitigate one or more of the above-noted issues, whether identified herein or elsewhere.

SUMMARY

According to one embodiment of the present invention, there is provided a method of bonding a MEMS device to a substrate to form a MEMS device assembly comprising the following steps. Determining the thickness profile of the MEMS device and/or the flatness of the mating surface of the substrate. Depositing adhesive onto a mating surface of the MEMS device and/or the mating surface of the substrate. Bringing the mating surfaces of the MEMS device and substrate together, such that the adhesive can bond the MEMS device to the substrate. The volume of adhesive that is deposited at particular locations on the mating surface is selected to compensate for local variations in the thickness profile of the MEMS device and/or the flatness of the mating surface of the substrate.

According to another embodiment of the present invention, there is provided a substrate for supporting a MEMS device. The substrate has a mating surface for bonding to a corresponding mating surface of a MEMS device. The mating surface comprises a plurality of generally planar surface regions. The surface regions are generally aligned in a common plane and each surface region is at least partially surrounded by a recess.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIG. 1 depicts a lithographic apparatus that can incorporate a MEMS device assembly.

FIG. 2 schematically depicts an exploded perspective view of a MEMS assembly.

Figure 1:
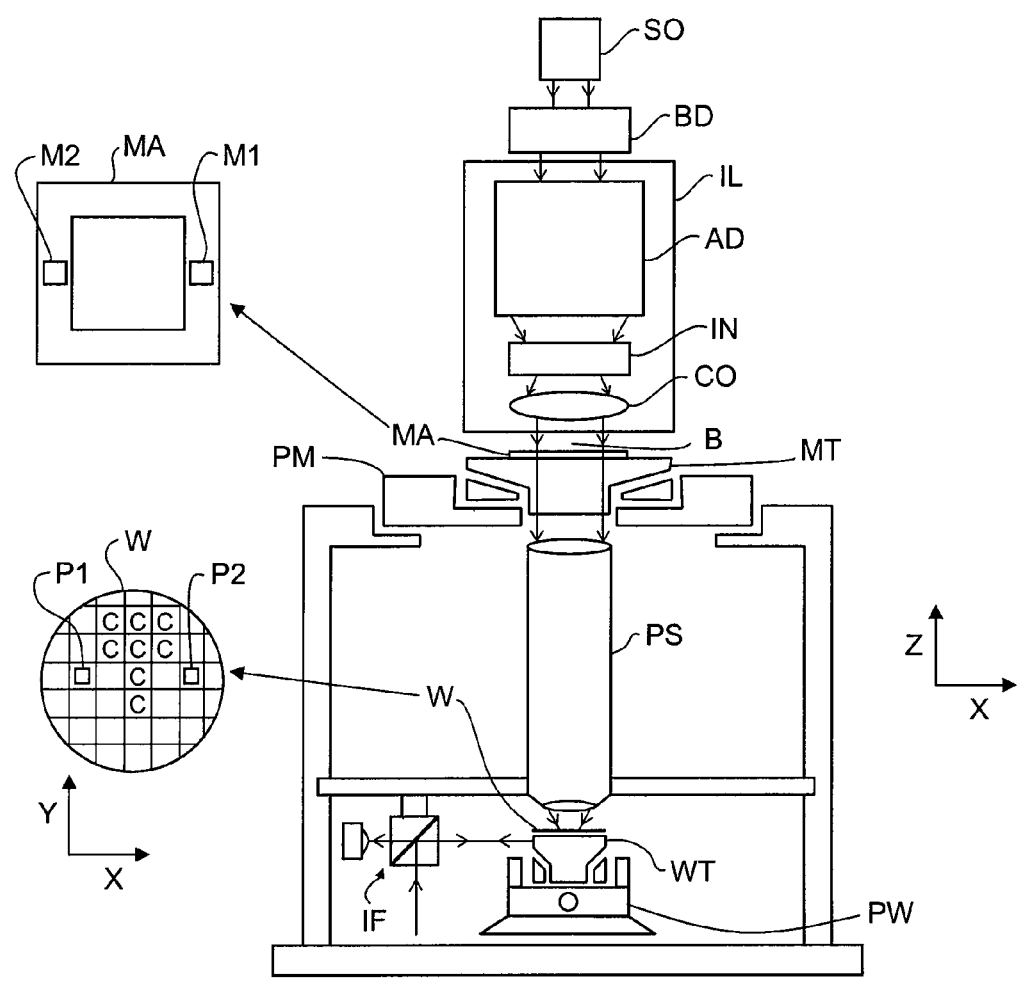

One or more embodiments of the present invention will now be described with reference to the accompanying drawings. In the drawings, like reference numbers can indicate identical or functionally similar elements. Additionally, the left-most digit(s) of a reference number can identify the drawing in that the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

One particular example of a MEMS device is a mirror array. A mirror array typically employs a matrix arrangement of small reflective elements (or mirrors), which are individually adjustable, for example tiltable about an axis (by means of an actuator), so as to apply a pattern to a reflected beam of radiation. Mirror arrays can alternatively be referred to as a "programmable mirror array", a "micromirror array" or an "active faceted mirror." Such mirror arrays have several uses and, in particular, can be utilized in lithographic apparatus. For example, it is known to utilize mirror arrays to form the patterning device of a lithographic apparatus (e.g., in a lithographic apparatus for use in the manufacture of flat panel displays). More recently, the use of mirror arrays in the illumination system of a lithographic apparatus has also been proposed.

For completeness, a lithographic apparatus that can comprise a MEMS device assembly (or a MEMS device assembled using the method of the invention), for example a mirror array described in detail below. However, a skilled artisan will appreciate that a mirror array for use in a lithographic apparatus is merely one possible application for a MEMS device, and in its broadest form the invention is not intended to be limited to a MEMS device for any particular use. Several other uses for the MEMS device of the present invention, or a MEMS device assembled using the exemplary method of the present invention, will be apparent to the skilled artisan.

A lithographic apparatus is a machine that applies a desired pattern onto a target portion of a substrate. The lithographic apparatus can be used, for example, in the manufacture of integrated circuits (ICs). In that circumstance, a patterning device, which is alternatively referred to as a mask or a reticle, can be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist).

In general, a single substrate will contain a network of adjacent target portions that are successively exposed. Known lithographic apparatus include steppers, in that each target portion is irradiated by exposing an entire pattern onto the target portion in one go, and scanners, in that each target portion is irradiated by scanning the pattern through the beam in a given direction (the "scanning"-direction) while synchronously scanning the substrate parallel or anti-parallel to this direction.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to devices that can be used to impart a beam with a pattern in its cross-section, such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

Patterning device can be transmissive or reflective. Examples of patterning device include masks, MEMS devices (such as programmable mirror arrays), and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of that can be individually tilted so as to reflect an incoming radiation beam in different directions; in this manner, the reflected beam is patterned. The patterning device can, for example, comprise a MEMS device assembly according to one or more embodiments or examples of the invention, or a MEMS device assembled using a method according to one or more embodiments of the present invention.

The support structure supports, i.e., bears the weight of, the patterning device. It holds the patterning device in a way that depends on the orientation of the patterning device, the design of the lithographic apparatus, and other conditions, such as, for example, whether or not the patterning device is held in a vacuum environment. The support can use mechanical clamping, vacuum, or other clamping techniques, for example electrostatic clamping under vacuum conditions. The support structure can be a frame or a table, for example, which can be fixed or movable as required and that can ensure that the patterning device is at a desired position, for example with respect to the projection system. Any use of the terms "reticle" or "mask" herein can be considered synonymous with the more general term "patterning device."

The term "projection system" used herein should be broadly interpreted as encompassing various types of projection systems, including refractive optical systems, reflective optical systems, and catadioptric optical systems, as appropriate for example for the exposure radiation being used, or for other factors, such as the use of an immersion fluid or the use of a vacuum. Any use of the term "lens" herein can be considered as synonymous with the more general term "projection system."

The illumination system can also encompass various types of optical components, including refractive, reflective, and catadioptric optical components, for directing, shaping, or controlling the beam of radiation, and such components can also be referred to below, collectively or singularly, as a "lens." As mentioned above, the illumination system can also comprise a MEMS device assembly according to one embodiment of the invention, or a MEMS device assembled using a method according to one embodiment of the invention.

The lithographic apparatus can be of a type having two (dual stage) or more substrate tables (and/or two or more mask tables). In such "multiple stage" machines, the additional tables can be used in parallel, or preparatory steps can be carried out on one or more tables while one or more other tables are being used for exposure.

The lithographic apparatus can also be of a type wherein the substrate is immersed in a liquid having a relatively high refractive index, e.g. water, so as to fill a space between the final element of the projection system and the substrate. Immersion liquids can also be applied to other spaces in the lithographic apparatus, for example, between the mask and the first element of the projection system. Immersion techniques are well known in the art for increasing the numerical aperture of projection systems.

FIG. 1 schematically depicts a general lithographic apparatus, according to one embodiment of the present invention. The apparatus includes an illumination system (illuminator) IL configured to condition a radiation beam B (e.g., UV radiation, DUV, EUV, or any other suitable radiation), a patterning device support structure (e.g., a pattern device table) MT constructed to support a patterning device (e.g., a static or dynamic patterning device) MA and connected to a first positioning device PM configured to accurately position the patterning device in accordance with certain parameters. The apparatus also includes a substrate table (e.g., a wafer table or glass substrate table) WT or "substrate support" constructed to hold a substrate (e.g., a resist coated wafer or glass flat panel display substrate) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

Referring to FIG. 1, the illuminator IL receives a radiation beam from a radiation source SO. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL can include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can include various other components, such as an integrator IN and a condenser CO. The illuminator can be used to condition the radiation beam, to have a desired uniformity and intensity distribution in its cross section.

The radiation beam B is incident on the patterning device (e.g., mask MA), which is held on the patterning device support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (that is not explicitly depicted in FIG. 1) can be used to accurately position the mask MA with respect to the path of the radiation beam B, e.g., after mechanical retrieval from a mask library, or during a scan. In general, movement of the mask table MT can be realized with the aid of a long-stroke module (coarse positioning) and a short-stroke module (fine positioning), which form part of the first positioning device PM. Similarly, movement of the substrate table WT or "substrate support" can be realized using a long-stroke module and a short-stroke module, which form part of the second positioner PW.

In the case of a stepper (as opposed to a scanner) the mask table MT can be connected to a short-stroke actuator only, or can be fixed. Mask MA and substrate W can be aligned using mask alignment marks M1, M2 and substrate alignment marks P1, P2. Although the substrate alignment marks as illustrated occupy dedicated target portions, they can be located in spaces between target portions (these are known as scribe-lane alignment marks). Similarly, in situations in that more than one die is provided on the mask MA, the mask alignment marks can be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" can be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above. When a microlens array is used in a projection system of a maskless system, pixel grid imaging can be used to expose patterns from a patterning device, through the microlens array, and onto the substrate.

Combinations and/or variations on the above described modes of use or entirely different modes of use can also be employed.

Figure 2:
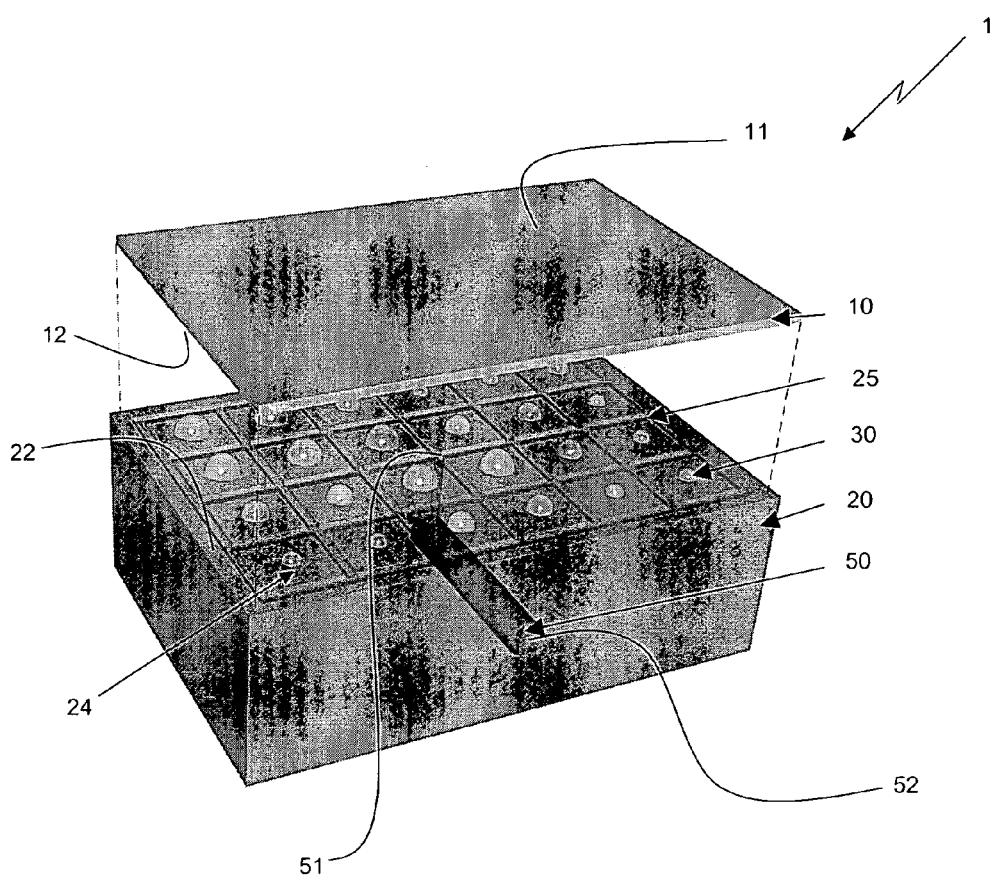

FIG. 2 shows a MEMS device assembly 1. MEMS device assembly 1 comprises a MEMS device 10 mounted on a supporting substrate 20. The MEMS device 10 is connected to the substrate 20 to form the MEMS device assembly 1 during manufacture. The supporting substrate 20 can, for example, comprise a silicon carbide (SiC) substrate. The MEMS device 10 can, for example, comprise a mirror array or an image chip. The MEMS device 10 and the substrate 20 can, for example, be connected by bonding, for example using a fixation medium such as adhesive (e.g., a liquid adhesive, such as glue).

When the MEMS device 10 and substrate 20 are connected to form the assembly 1, a first surface 11 of the MEMS device 10 is provided on an external surface of the assembly 1. The first surface 11 can typically comprise at least one active feature, and will therefore be referred to herein as the "active surface" of the MEMS device 10. For example, in the case of an optical MEMS device assembly the active surface 11 can comprise at least one active optical feature (e.g., a reflective element). The MEMS device 10 also comprises a second surface 12 that is arranged to be fixed to (or engaged by) a corresponding surface 22 of the substrate 20. These surfaces will be referred to as the "mating surfaces" of the MEMS device 10 and the substrate 20. The mating surface 12 and the active surface 11 of the MEMS device 10 are arranged on opposing sides of the MEMS device 10.

As mentioned above, in some applications it can be of importance to be provided with an active surface 11 that is extremely flat. Accordingly, in one example a MEMS device assembly 1 has an active surface 11 with an improved flatness. The flatness of a surface can, for example, be defined as a measure of the extent to that points on the surface deviate from a planar surface, or the extent to that the contours of the surface approximate a single level plane. As such, it will be appreciated that the flatness of a surface can, for example, be increased by decreasing the magnitude of any deviations from the general plane of the surface.

It can be appreciated that if, for example, the flatness of a surface is of the same order of magnitude as the roughness of the surface. The roughness can also have an impact on the flatness of the surface. For example, in the case of specified flatness of 10 nm, roughness can have an impact on flatness since it is in the same order of magnitude.

In gluing a MEMS device to a surface, however, surface roughness need not generally be taken into account to achieve flatness. Surface roughness can, however, have an impact on gluing behavior and the skilled artisan will appreciate that this effect can need to be taken into account.

Figure 3:
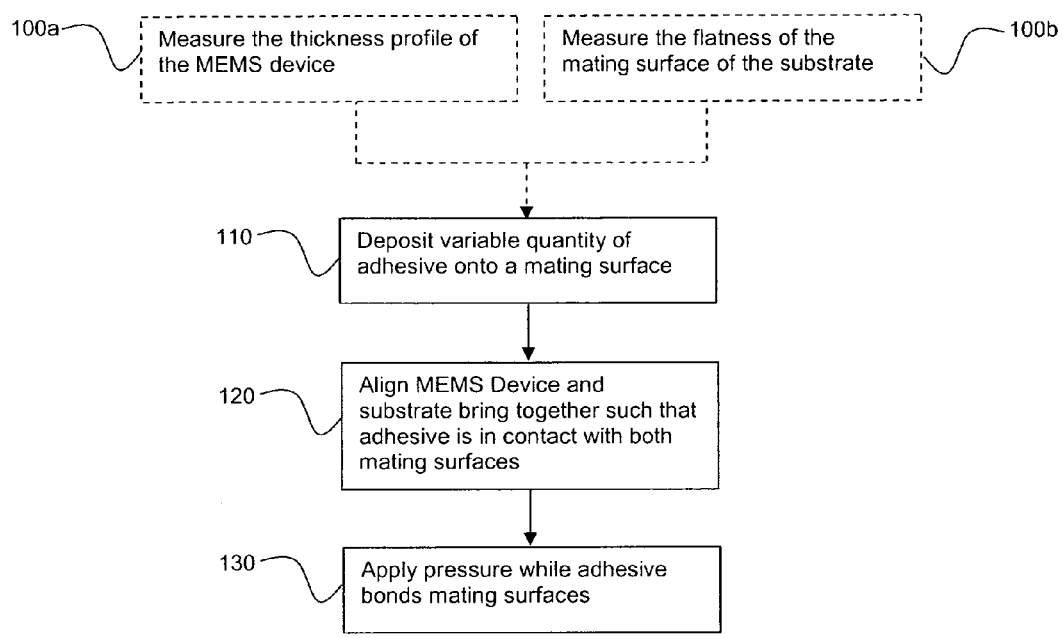
FIG. 3 depicts the method of bonding a MEMS device to a substrate.

FIG. 3 shows a flowchart depicting a method. The method can be performed to bond a MEMS device 10 to a substrate 20 to form a MEMS device assembly 1.

In step 100a, a determination of a thickness profile of the MEMS device 10 is performed. In step 100b, a determination of a flatness of a mating surface 22 of a substrate 20 is performed. Additionally, or alternatively, only one, and not both, of the measurement steps 100a and 100b can be included in the method. In step 110, a volume of adhesive 30 is deposited onto at least one of the mating surfaces 12, 22 of the MEMS device 10 and the substrate 20. In step 120, mating surfaces 12 and 22 are brought together such that the adhesive can bond the MEMS device to the substrate. In step 130, pressure is applied while adhesive 30 bonds mating surfaces 12 and 22.

It is to be appreciated that the volume of adhesive 30 applied at different locations can be specifically selected to compensate for any unflatness that would otherwise occur in the active surface 11 of the MEMS device 10 when assembled. Accordingly, the volume of adhesive 30 can be varied from one location on the mating surfaces 12, 22 to another. By varying the volume of adhesive deposited at particular locations on the mating surface(s) 12, 22, adhesive 30 may not only bond the MEMS device 10 and substrate together, but also can compensate for local variations in the thickness profile of the MEMS device 10 and/or the flatness of the mating surface 22 of the substrate 20. Accordingly, embodiments of the present invention can provide a method of manufacturing a MEMS device assembly, which in some embodiments at least can provide an improved active surface flatness. In one example, it can be sufficient to assume that mating surface 22 of the substrate 20 is sufficiently flat such that only variations in the thickness of the MEMS device 10 need to be compensated. However, in other examples variations in both the substrate 20 and the MEMS device 10 can be compensated.

Returning to FIG. 2, this figure shows droplets of adhesive 30 having differing volumes deposited on the mating surface 22 of the substrate 20. However, it will be appreciated that, for clarity, the variation in the volume of the glue drops is heavily exaggerated. Flatness and thickness errors of the MEMS device 10 and the substrate 20 are not visible in FIG. 2.

There are various methods (e.g., methods for capturing topography) that can be suitable for measuring the thickness profile of the MEMS device 10 and/or the flatness of the mating surface 22 of the substrate 20. Optical scanning can, for example be used to measure the thickness profile of the MEMS device 10 and/or the flatness of the mating surface 22 of the substrate 20. In some embodiments, the measurements can, for example, be carried out by means of 3D deflectometry. For example Trioptics GmbH of Wedel, Germany produce 3D deflectometry equipment suitable for measuring the unflatness of virtually flat industrial surfaces. Their equipment can be suitable for scanning a substrate with an accuracy of greater than about 10 nm and can, therefore, be suitable for use in one or more embodiments of the invention.

The adhesive can, for example, comprise a two-part epoxy and can, for example, be curable at room temperature. For example, suitable adhesives can include, but are not limited to: EpoTek 301-2FL—commercially available from Epoxy Technology, Inc. of Billerica, Mass., USA; W19 combined with 24LV—commercially available from Emerson & Cuming of Billerica, Mass., USA; or Araldite DBF combined with hardener HY956 EN—commercially available from Vantico of East Lansing, Mich., USA. In the arrangement shown in FIG. 2 the droplets are deposited onto the mating surface 22 of the substrate 20. It will, however, be appreciated that in some embodiments the adhesive 30 can be deposited, additionally or alternatively, onto the mating surface 12 of the MEMS device 10.

The adhesive can, for example, be applied using a fluid dispenser. The dispenser can, for example, be arranged to dispense adhesive in droplets having a volume that varies between about 1 picoliter and 10 nanoliters (e.g., the volume can be varied between about 10 picoliters and 1 nanoliter). The fluid dispenser can, for example, comprise a nozzle arrangement such as an ink-jet or bubble-jet arrangement or using a micro pump. For example, Dimatix, Inc. of Santa Clara, Calif., USA and Microdrop Technologies GmbH of Norderstedt, Germany produce fluid dispensers that are suitable for dispensing droplets of liquid in droplets in the nanoliter to picoliter range and can, therefore be suitable for use in embodiments of the invention.

The adhesive 30 (e.g., glue) can be deposited in a series of spaced apart droplets. The volume of each individual droplet of adhesive 30 can, for example, be varied in order to compensate for any local (i.e., in the region that the droplet is applied) variations in the thickness profile of the MEMS device and/or the flatness of the mating surface of the substrate. In other embodiments, each individual droplet of adhesive 30 can have an equal volume and the volume of adhesive that is deposited at any particular location can be varied by varying the number of droplets applied in a local region (e.g., by varying the spacing between individual droplets or by depositing multiple droplets at some locations).

In some embodiments, the mating surface 22 of the substrate 20 can be divided into a plurality of regions 24 for receiving adhesive and the method can further comprise calculating the volume (and, since the region can have a known area, the thickness) of adhesive 30 required in each region 24 to compensate for local variations in the thickness profile of the MEMS device 10 and/or the flatness of the mating surface 22 of the substrate 20. For example, a single droplet of adhesive 30 having a pre-determined volume could be deposited in each region 24.

Figure 4:
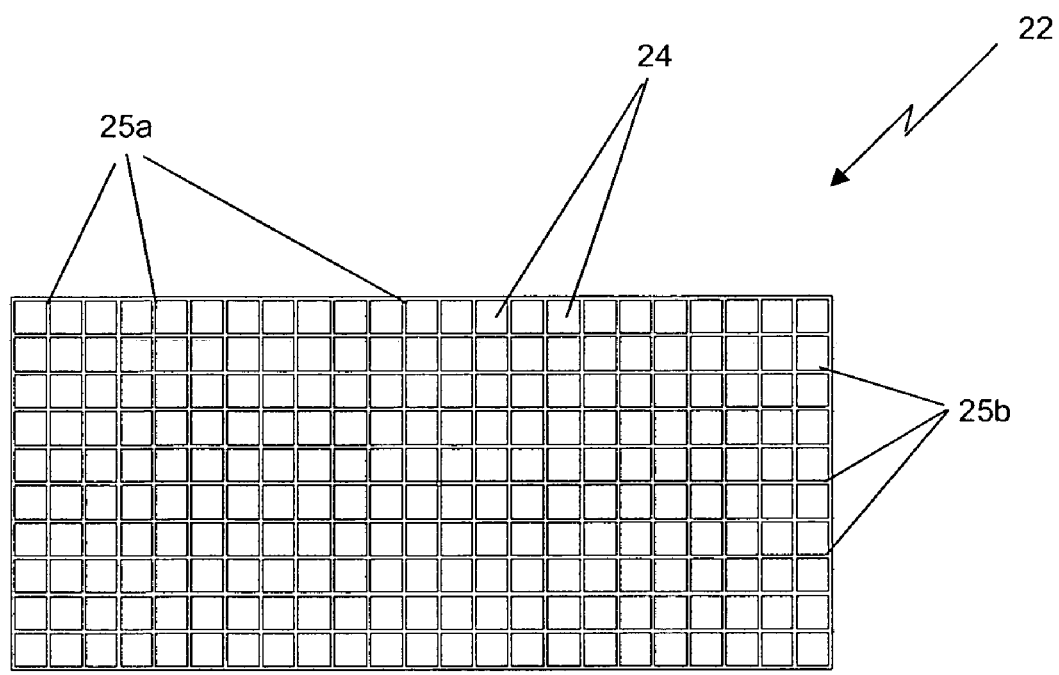
FIG. 4 depicts a plan view of the mating surface of a substrate.

With reference to FIGS. 2 and 4, in one embodiment the mating surface 22 of the substrate 20 comprises a plurality of regions 24 and each region is separated from an adjacent region by a recess 25. The regions 24 can be at least partially surrounded by recesses 25 or the region 24 can, for example, be substantially surrounded by recesses 25. For example, a recess 25 can surround each region 24. The mating surface regions 24 can, for example, be rectangular regions of the mating surface 22. The mating surface regions 24 can be provided on the mating surface 22 of the substrate 20 arranged in rows, which extend in two perpendicular directions. As such, in this embodiment the recesses 25 separating the regions 24 comprise a plurality of grooves, which each extend along the edge of a plurality of surface regions 24. The recesses 25 can, for example, be provided in the form of a grid arrangement of grooves (as shown in FIG. 4). For example, a first plurality of spaced apart parallel grooves 25a can be provided on the mating surface 22 of the substrate 20 extending in a first direction and a second plurality of spaced apart parallel grooves 25b can be provided on the mating surface 22 of the substrate 20 extending in a second direction (that is, for example, perpendicular to the first direction).

In the example of FIG. 4, the mating surface regions 24 are each about 1.85 mm by 1.743 mm and the mating surface 22 is provided with a matrix of about 10 by 23 regions. Accordingly 230 rectangles are shown on the substrate of FIG. 4, each representing a region 24 for receiving adhesive and each substantially entirely surrounded by the grid of recesses 25. The recesses can, for example, be about 0.2 mm in width and, for example, have a depth of approximately 100 μm. Various techniques can be suitable for forming the pattern of recesses and mating surface regions 24 in the substrate, for example powder blasting, laser ablation or etching.

Figure 5:
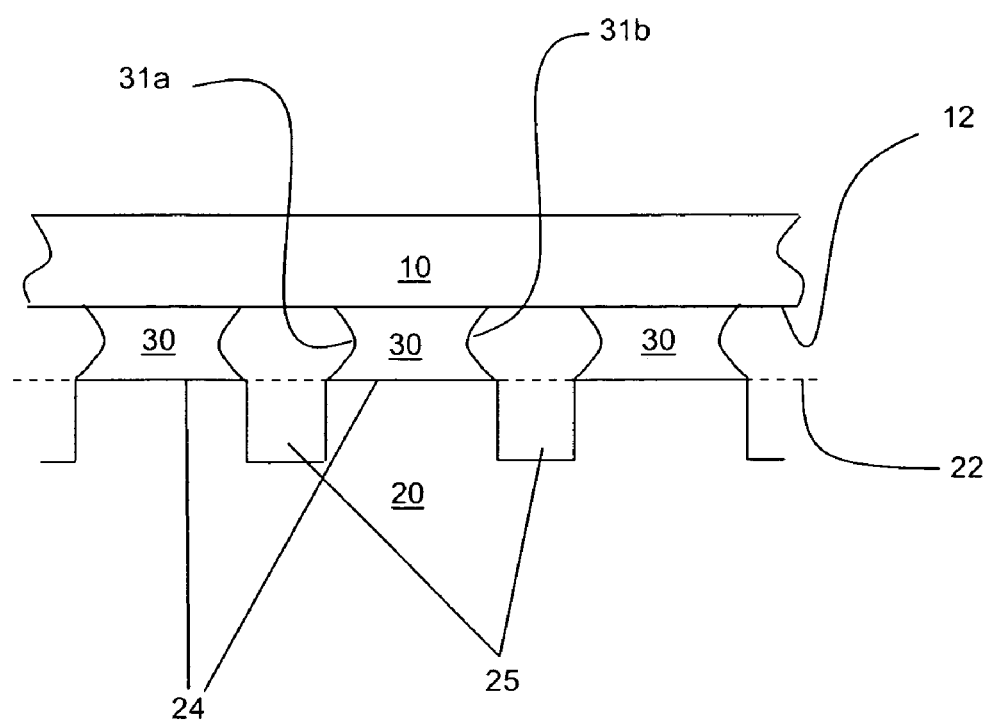
FIG. 5 depicts a cross sectional view of a portion of a MEMS device assembly.

The effect of the regions 24 surrounded by recesses 25 will now be described with reference to FIG. 5. A MEMS device 10 is located over a substrate 20 and is brought into contact with the droplets of adhesive 30, which have been deposited on the regions 24 of the mating surface 22. A skilled artisan will appreciate that any convenient device can be used to position (and align) the MEMS device 10 above the substrate 20, for example using a suitably sized MEMS device holder and an actuator (not shown).

The MEMS device 10 and substrate 20 can be moved together until their respective mating surfaces 12, 22 are both in contact with the droplets of adhesive 30. The relative movement of the MEMS device 10 towards the substrate 20 can, for example, continue until air that is located between the mating surfaces and the adhesive 30 has escaped. In some embodiments, it can, for example, be important to ensure that the substrate 20 and MEMS device 10 remain in alignment to ensure that the mating surfaces 12, 22 are brought into contact with all of the individual droplets of adhesive 30.

When the MEMS device 10 and substrate 20 have been brought sufficiently together the capillary effect will result in a meniscus 31 being formed (due to interfacial tension of the liquid) around the perimeter of the adhesive, between the mating surfaces 12, 22 (that are now bounding the adhesive on opposing sides).

The meniscus is constrained at the edge of a target region by the recesses 25 (that can, for example, be provided with a sharp edge to help ensure that the meniscus remains strongly attached to the edge of the region 24). For example, in the cross section of FIG. 5 a meniscus 31a, 31b has been formed at either side of each drop of adhesive 30. Due to the meniscus 31 being constrained by the edge of the recesses 25 (that generally surrounds the region 24) the capillary effect will help to ensure that individual droplets of adhesive 30 each spread out across the entire surface area of each region 24. Thus, by ensuring that the adhesive 30 has a predetermined surface area (i.e., which of the region 24) it is possible to simply calculate the volume of adhesive 30 that should be applied to each region in order to provide a particular height of adhesive (and the height of the adhesive 30 can, therefore, be set to improve the flatness of the active surface 11 of the MEMS device 10).

Referring again to FIG. 2, in some embodiments the substrate 20 can further comprise a conduit 50 (the substrate in FIG. 2 is shown partially transparent so that the conduit is visible). The conduit has at least one opening 51 on the substrate mating surface 22. The conduit 50 can, for example, have a single 51 opening located in a central region of the substrate mating surface 22. The opening 51 can, for example, be located within a recess 25. The conduit can further comprise a second opening 52 on a second surface of the substrate 20. The conduit can be arranged to provide a fluid connection between the mating surface 22 and another surface of the substrate.

In use, air can be extracted through the conduit 50. For example, air can be extracted from the first opening 51 on the mating surface. By extracting air through the conduit after bringing the substrate 20 and the MEMS device 10 proximal to one another, the local pressure between the mating surfaces 12, 22 can be reduced. A suction effect (e.g., a vacuum effect or partial vacuum effect) will be generated between the surfaces 12, 22 that will urge the surfaces together. The extraction (and, therefore, the suction effect) can be maintained, for example, to hold the surfaces in alignment, until the adhesive 30 has cured. The suction effect can, for example, enable more accurate alignment of the MEMS device 10 on the substrate 20. The extraction can, for example, be provided by connecting a vacuum pump to the second outlet 52.

By providing the opening 51 within a recess 25 on the surface of the substrate mating surface 22, the recesses can be used as to distribute the extraction flow of air across the surface. Accordingly, it may only be necessary to provide a single central opening 51 and the grid of recesses 25 can distribute the suction pressure across the mating surface 22. An evenly distributed suction pressure can be applied to the MEMS device 10 to urge it onto the substrate and maintain alignment of the MEMS device 10 and the substrate 20.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method of bonding a MEMS device to a substrate to form a MEMS device assembly, the method comprising:
    determining at least one of a thickness profile of the MEMS device and a flatness of a mating surface of the substrate;
    depositing adhesive onto at least one of a mating surface of the MEMS device and the mating surface of the substrate; and
    bringing the mating surfaces of the MEMS device and substrate together, such that the adhesive bonds the MEMS device to the substrate,
    wherein a volume of the adhesive deposited at respective locations on one or both of the mating surfaces is selected to compensate for local variations in the thickness profile of the MEMS device or the flatness of the mating surface of the substrate.

2. The method of claim 1, further comprising:
    forming an active surface on the MEMS device, the active surface opposing the mating surface and a size of droplets of the adhesive are selected, such that the active surface of the MEMS device is provided with an improved flatness after bonding.

3. The method of claim 1, wherein the determining step comprises measuring the thickness profile of the MEMS device or the flatness of the mating surface of the substrate using 3D deflectometry.

4. The method of claim 1, wherein the depositing step comprises depositing the adhesive in a series of spaced apart droplets, a volume of each of the droplets being selected to compensate for local variations in the thickness profile of the MEMS device or the flatness of the mating surface of the substrate.

5. The method of claim 1, wherein the mating surface of the substrate is divided into a plurality of regions, and the method further comprises:
    calculating a volume of the adhesive in each region to compensate for local variations in the thickness profile of the MEMS device or the flatness of the mating surface of the substrate.

6. The method of claim 5, wherein the depositing step comprises depositing the adhesive in a series of droplets, such that a volume of each of the droplets corresponds to a respective one of the calculated volumes.

7. The method of claim 5, further comprising separating adjacent regions on the mating surface of the substrate using a recess.

8. The method of claim 5, further comprising surrounding each region using recesses.

9. The method of claim 1, further comprising:
    applying pressure to urge the mating surfaces of the MEMS device and the substrate together during bonding.

10. The method of claim 9, further comprising applying the pressure through suction of the MEMS device onto the mating surface of the substrate.

11. The method of claim 10, further comprising:
    providing the substrate with at least one conduit having an opening on the substrate mating surface; and
    extracting air through the conduit so as to urge the MEMS device onto the substrate.

* * * * *